(12) United States Patent
Liao et al.

(10) Patent No.: US 7,473,598 B2
(45) Date of Patent: Jan. 6, 2009

(54) METHOD FOR FORMING STACK CAPACITOR

(75) Inventors: Shian-Hau Liao, Tai-Chung (TW);
Tsung-Shin Wu, Kao-Hsiung (TW);
Chih-Chiang Kuo, Taipei (TW);
Chien-Li Cheng, Hsin-Chu (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 135 days.

(21) Appl. No.: 11/738,511

(22) Filed: Apr. 22, 2007

(65) Prior Publication Data

US 2008/0261364 A1    Oct. 23, 2008

(51) Int. Cl.
*H01L 21/8242* (2006.01)
*H01L 21/20* (2006.01)
*H01L 21/4763* (2006.01)

(52) U.S. Cl. .................. 438/253; 438/239; 438/244; 438/396; 438/637; 438/640; 257/E21.008; 257/E21.009

(58) Field of Classification Search .......... 257/E21.008, 257/E21.009
See application file for complete search history.

(56) References Cited

U.S. PATENT DOCUMENTS

| 6,576,941 | B1 * | 6/2003 | Lee et al. | 257/295 |
| 7,407,852 | B2 * | 8/2008 | Su et al. | 438/243 |
| 2006/0102977 | A1 * | 5/2006 | Fucsko et al. | 257/499 |

* cited by examiner

*Primary Examiner*—Walter L Lindsay, Jr.
*Assistant Examiner*—Mohsen Ahmadi
(74) *Attorney, Agent, or Firm*—Winston Hsu

(57) ABSTRACT

A method for forming a stack capacitor includes providing a substrate with a bottom layer, a BPSG layer, a USG layer and a top layer thereon; using the top layer as a hard mask and the substrate as a first etching stop layer to perform a dry etching process to form a tapered trench in the bottom layer, the BPSG layer and the USG layer; removing the top layer to perform a selective wet etching process to partially remove the BPSG layer; depositing conformally a poly-Si layer and filling the trench with a sacrificial layer; removing the poly-Si layer unmasked by the sacrificial layer; using the bottom layer as a second etching stop layer to perform a wet etching process to remove the USG layer and BPSG layer; performing a static drying process; and depositing a dielectric layer and a conductive material to form the stack capacitor.

17 Claims, 8 Drawing Sheets

METHOD FOR FORMING STACK CAPACITOR

BACKGROUND OF THE INVENTION

1. Field of the Invention

The present invention relates to a method of forming a capacitor. More particularly, the present invention relates to a method for forming a stack capacitor by selective etching and static drying.

2. Description of the Prior Art

In dynamic random access memory (DRAM), two types of capacitors are conventionally used. One of the two is called the stack capacitor. In the process of forming the stack capacitor, first the rough shape of the capacitor is formed by dry etching. Then the sacrificial material filled in the capacitor is removed by a wet etching. Last, the remaining fluid is removed by spin-drying.

Under the trend of reducing the critical dimension, the aforementioned method encounters a lot of problems. First, the reduced critical dimension makes the capacitors closer, and the effective area on the capacitor structure is reduced. Second, as shown in FIG. 1, in the process of forming the rough capacitor by dry etching, a bulged part 100 appears at the collar of the capacitor column due to the characteristics of the reactive ion etching (RIE), this is called "bowing issue." The bowing issue along with the smaller capacitor pitch makes the capacitor columns collapse and suffer damages easily during the spin-drying.

So it is necessary to provide a novel process for forming the stack capacitors to solve the problems.

SUMMARY OF THE INVENTION

The present invention provides a method for forming a stack capacitor. The bowing issue is solved by a selective etching and the static drying can remove the liquid which is caused by the wet etching without damaging the structural integrity of the capacitors. The present invention therefore is suitable for the method of stack capacitor with smaller critical dimension. The method of forming the stack capacitor of the present invention includes:

providing a substrate with a bottom layer, a BPSG layer, a USG layer, and a top layer thereon;

using the top layer as a hard mask and the substrate as a first etching stop layer to perform a dry etching process to form a tapered first trench in the bottom layer, the BPSG layer and the USG layer;

removing the top layer;

performing a selective wet etching process to partially remove the BPSG layer to form a second trench with a bottle-like profile;

depositing conformally a poly-Si layer on the inner wall of the second trench and on the surface of the USG layer;

filling the second trench with a sacrificial layer;

removing the poly-Si layer unmasked by the sacrificial layer to expose the USG layer;

removing the sacrificial layer;

using the bottom layer as a second etching stop layer to perform a wet etching process to remove the USG layer and the BPSG layer;

performing a static drying process;

depositing a dielectric layer; and depositing a conductive material to form the stack capacitor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
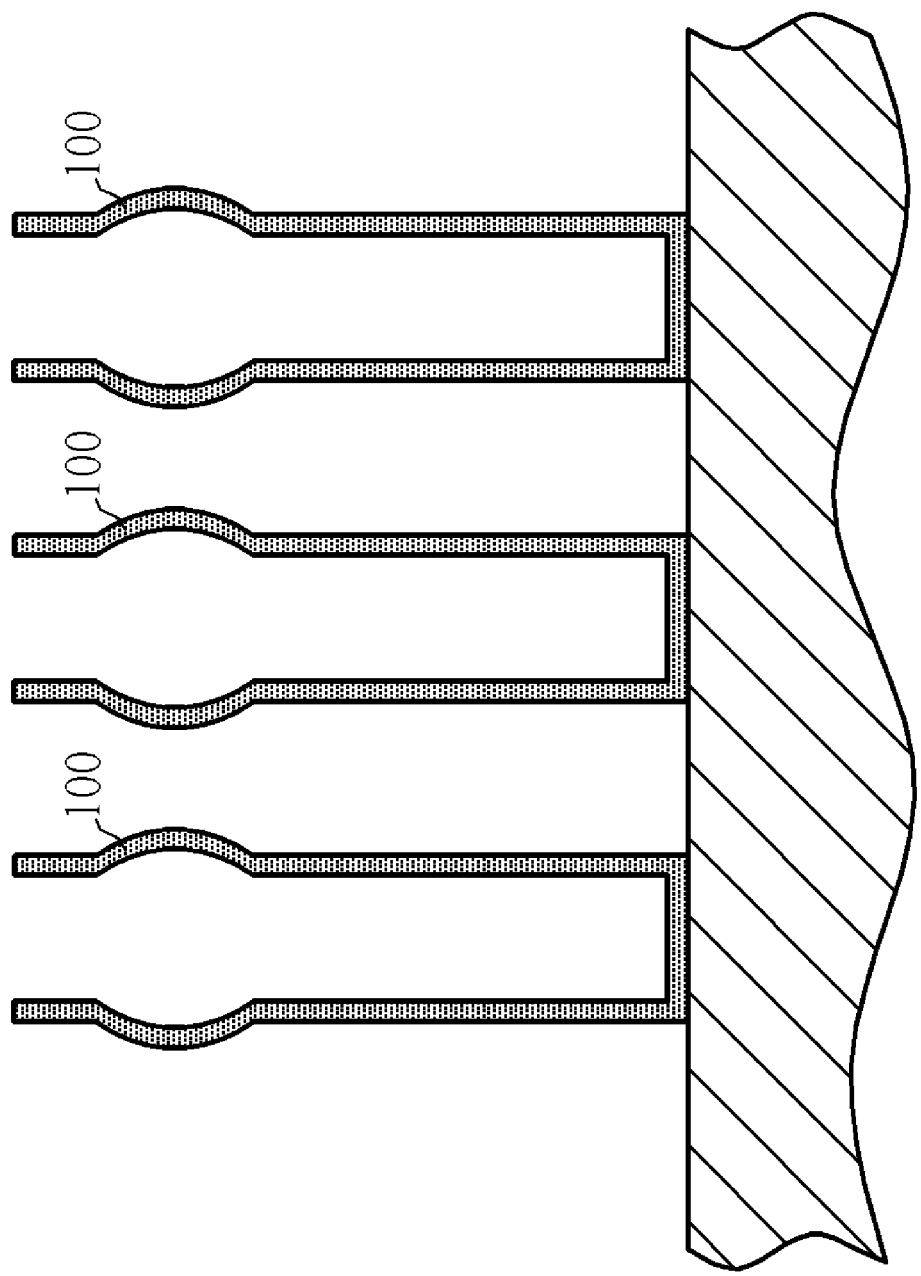
FIG. 1 illustrates that a bulged part appears at the collar of the capacitor column due to the characteristics of RIE in prior art.

The present invention relates to a method for forming a stack capacitor, which is characterized in that:

1. a composite capacitor structure is used to substantially increase the effective area of the capacitor;
2. using the selective etching method may eliminate the bowing issue; and
3. the static drying method may remove the liquid which is caused by the wet etching without damaging the structural integrity of the capacitors.

FIG. 2a to 2g illustrate a preferred embodiment of the method for forming a stack capacitor of the present invention. First, please refer to FIG. 2a, a conventional RIE is performed by using the substrate 200 as a first etching stop layer. The substrate 200 usually includes a semiconductor substrate, such as Si. A bottom layer 210, a BPSG layer 220, a USG layer 230 and a top layer 240 are formed thereon according to the conventional way in advance.

First the patterned top layer 240 is used as a dry etching hard mask, then the RIE is performed to etch the bottom layer 210, the BPSG layer 220 and the USG layer 230 to form a tapered first trench 250 and leaves a notch 221 in the BPSG layer 220 near the USG layer 230. The top layer 240 is removed after the RIE is done.

The bottom layer 210 usually includes a pad nitride layer and a buried SiN. The pad nitride layer is usually formed by a thermo oxidation method or a CVD method with a thickness of 30 Å. The buried SiN is usually formed by a CVD method with a thickness of 1500-2000 Å. The BPSG layer 220 may include a borosilicate glass or a borophosphosilicate glass with a thickness of 15000-18000 Å. The thickness of the USG layer 230 may be 2000-4000 Å.

The top layer 240 used as the dry etching hard mask usually includes poly-Si with a thickness of 2000-3000 Å. The poly-Si of the top layer 240 may be removed by a dry etching method.

Figure 2A:
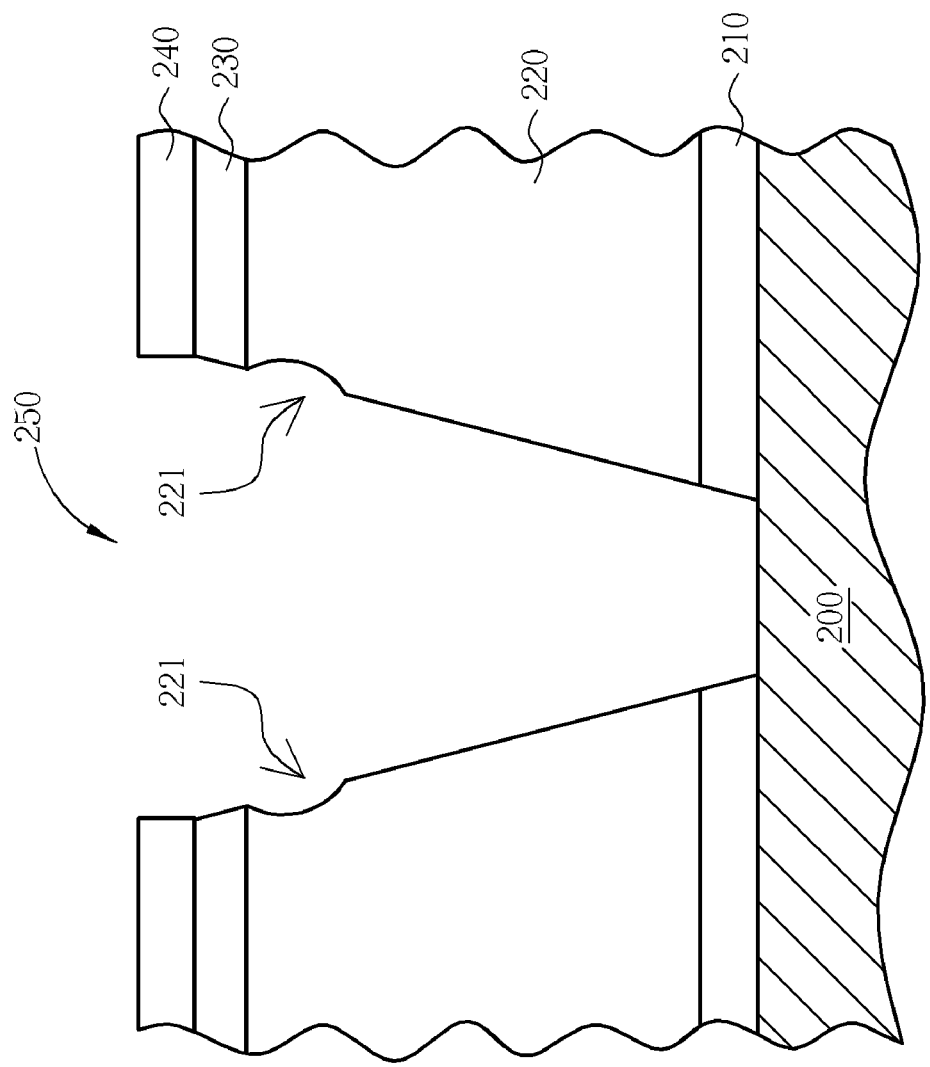
FIG. 2a to 2g illustrate a preferred embodiment of the method for forming a stack capacitor of the present invention.
Figure 2B:
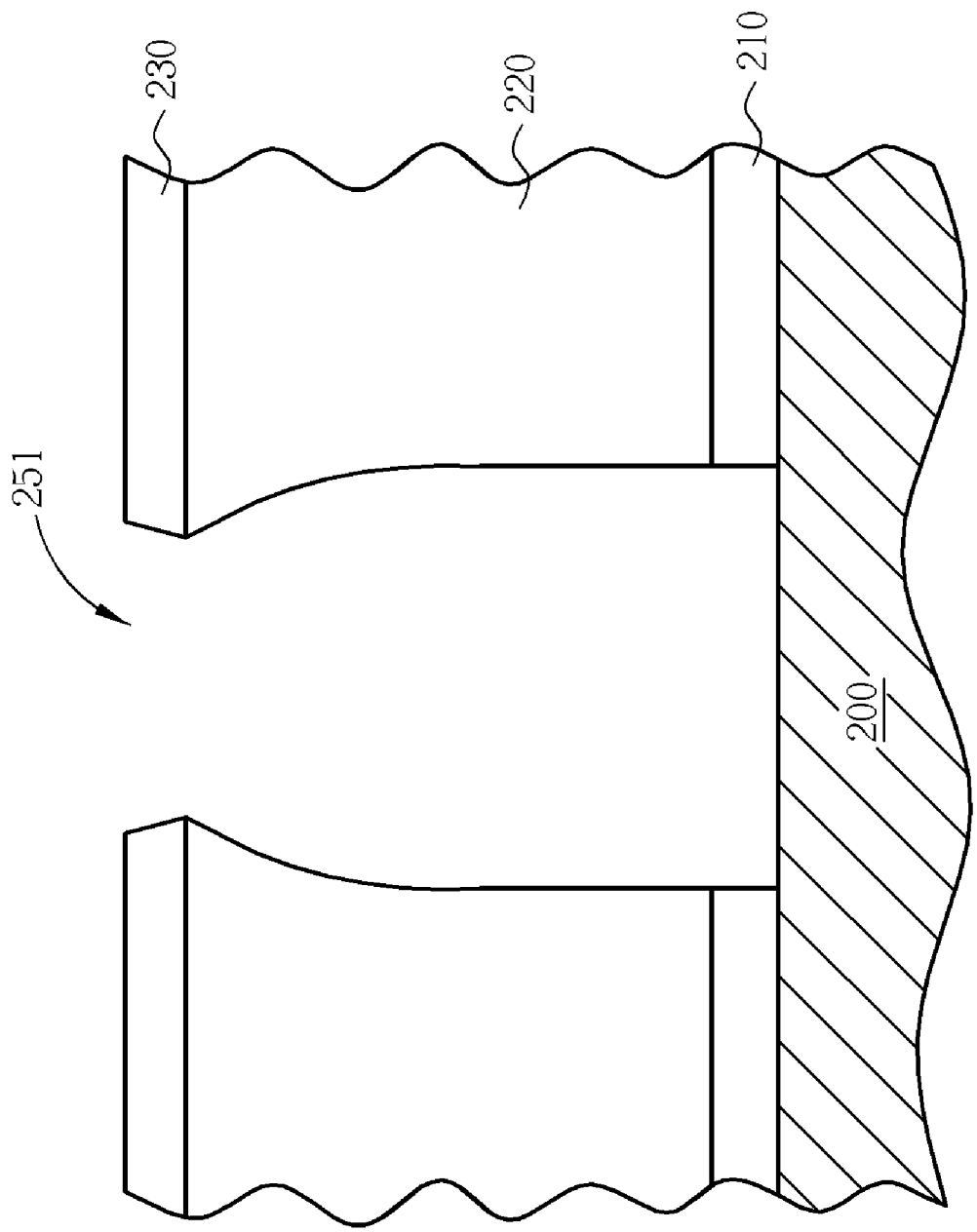

Please refer to FIG. 2b. Now a selective wet etching process is performed to remove part of the BPSG layer 220 to form a second trench 251 with a bottle-like profile. Due to the selective wet etching, the second trench 251 has a bottom-larger-than-top shape, i.e. a Bordeaux wine bottle shape with a high shoulder. That is, the BPSG layer 220 has an inclined shoulder in the BPSG layer 220 near the USG layer 230. At this time, the notch 221 caused by the RIE disappears because of the selective wet etching. The selective wet etching may use 0.5 vol. % dilute HF for about 5 minutes.

Figure 2C:
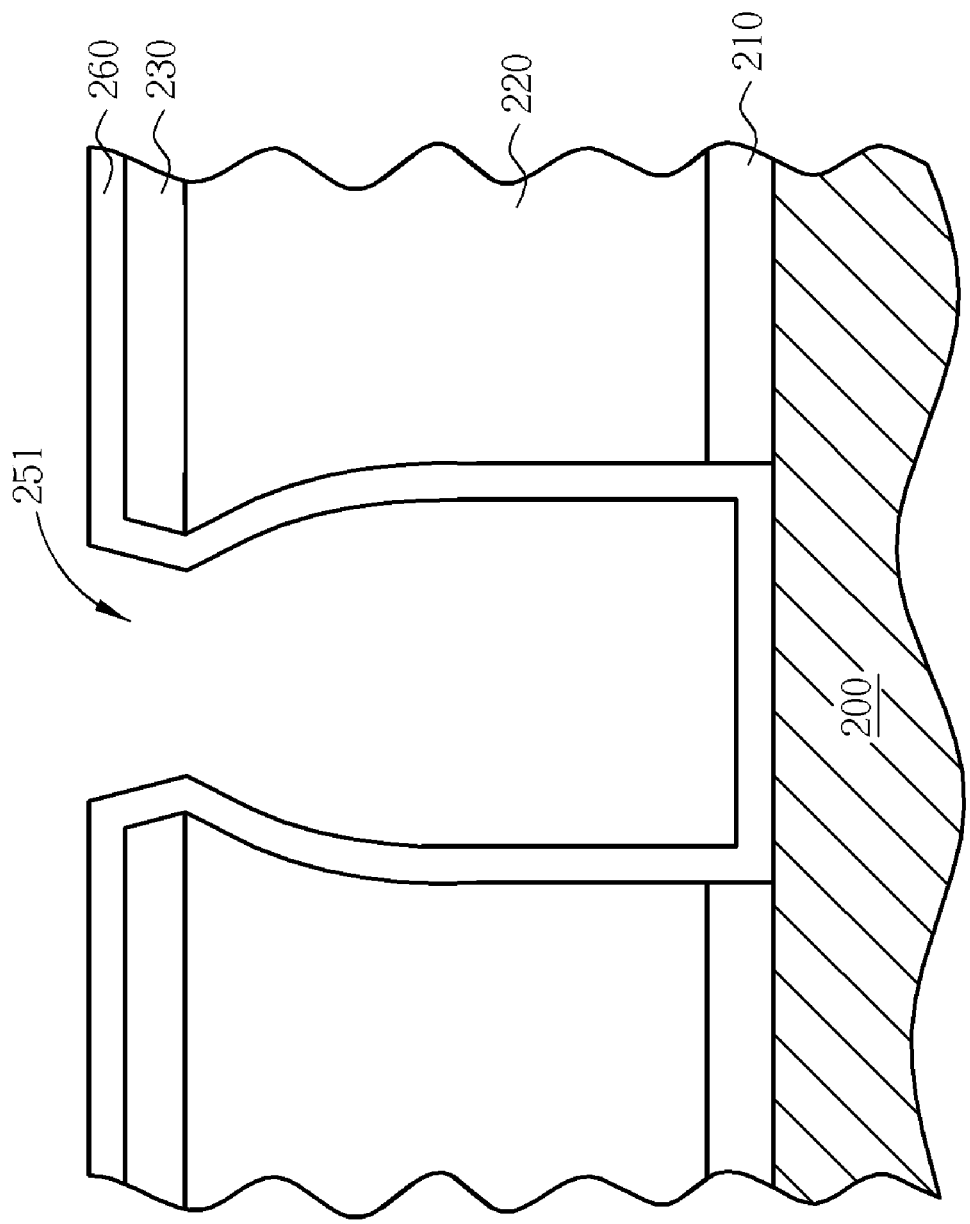

Please refer to FIG. 2c. A poly-Si layer 260 is conformally deposited on the inner wall of the second trench 251 and on the surface of the USG layer 230. For example, a low-pressure furnace method may be used to form the poly-Si layer 260 with a thickness of 300-500 Å.

Figure 2D:
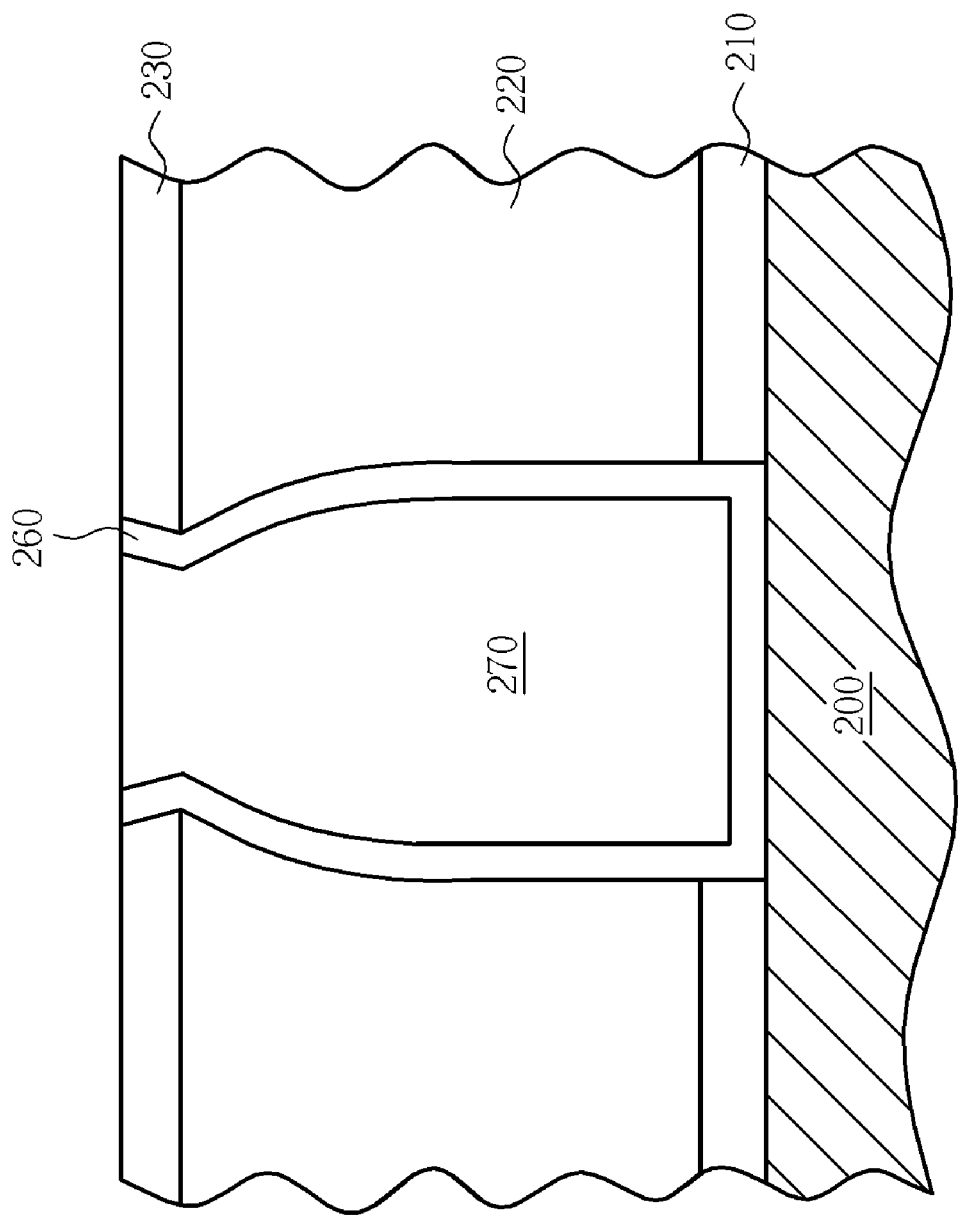

Please refer to FIG. 2d. The second trench 251 is filled with a sacrificial layer 270. Later both the sacrificial layer 270 and the poly-Si layer 260 outside the second trench 251 are removed by a polishing method such as CMP to expose the USG layer 230. The sacrificial layer 270 may preferably include a photoresist. Any photoresist which can be readily removed is suitable.

Figure 2E:
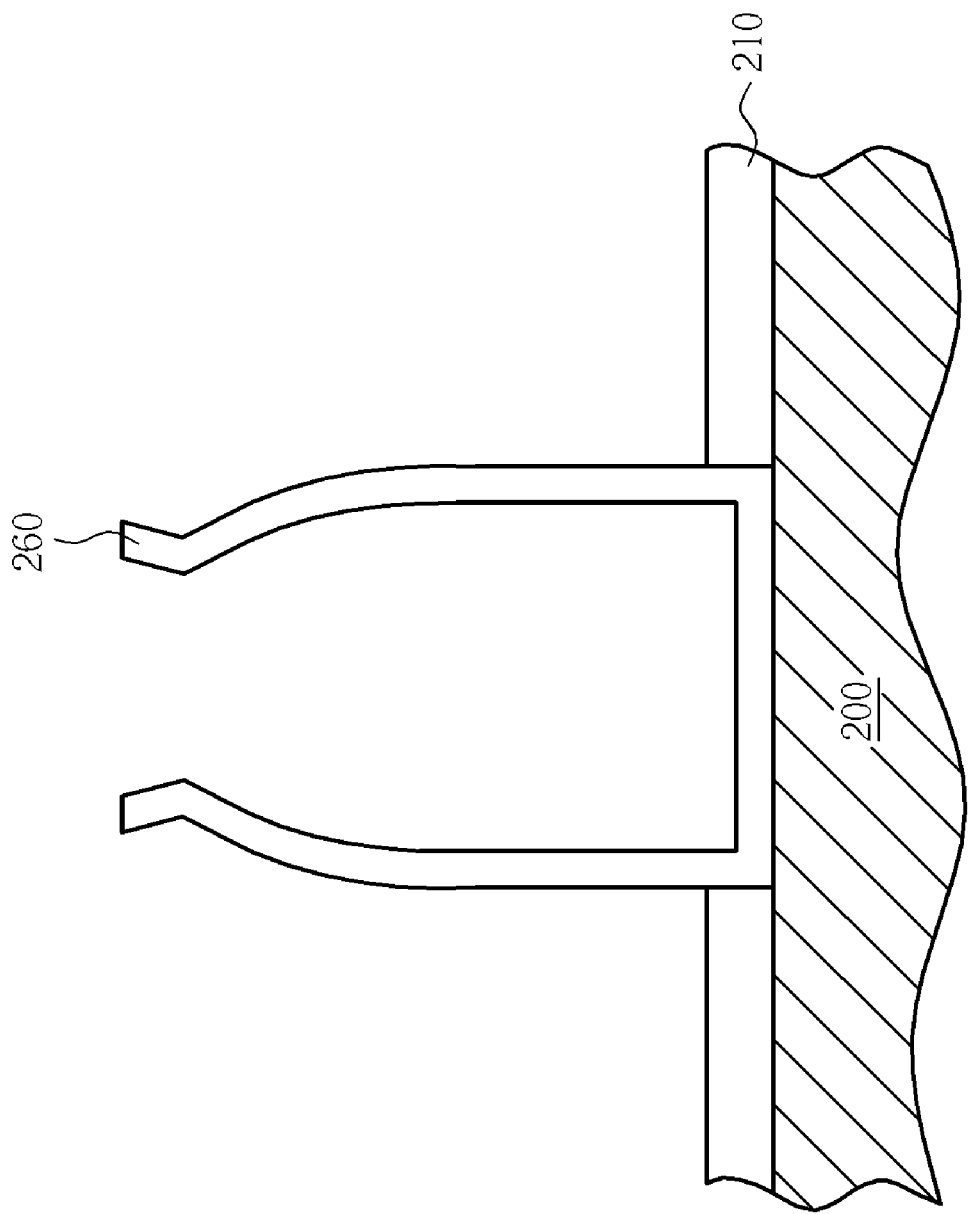

Please refer to FIG. 2e. First, the sacrificial layer 270 is removed. A wet etching process is performed using the bottom layer 210 as a second etching stop layer to remove the USG layer 230 and the BPSG layer 220. Because the sacrificial layer 270 may preferably be a photoresist, the sacrificial layer 270 may preferably be removed by a conventional method. In addition, the wet etching process may be performed using a fluoride for about 10-20 minutes to preferably entirely remove the BPSG layer 220 and the USG layer 230. The fluoride may be a HF solution, such as a 5 vol. % HF solution for 15 minutes.

Then a drying method is performed to completely remove the liquid caused by the wet etching. The drying method may preferably be a static drying method for avoiding damaging the fragile poly-Si layer 260. For example, a volatile solvent may be used, preferably an organic solvent miscible with water such as isopropanol. In a preferred embodiment of the present invention, a non-spin static drying method using isopropanol may be used to evaporate the liquid caused by the wet etching method.

Figure 2F:
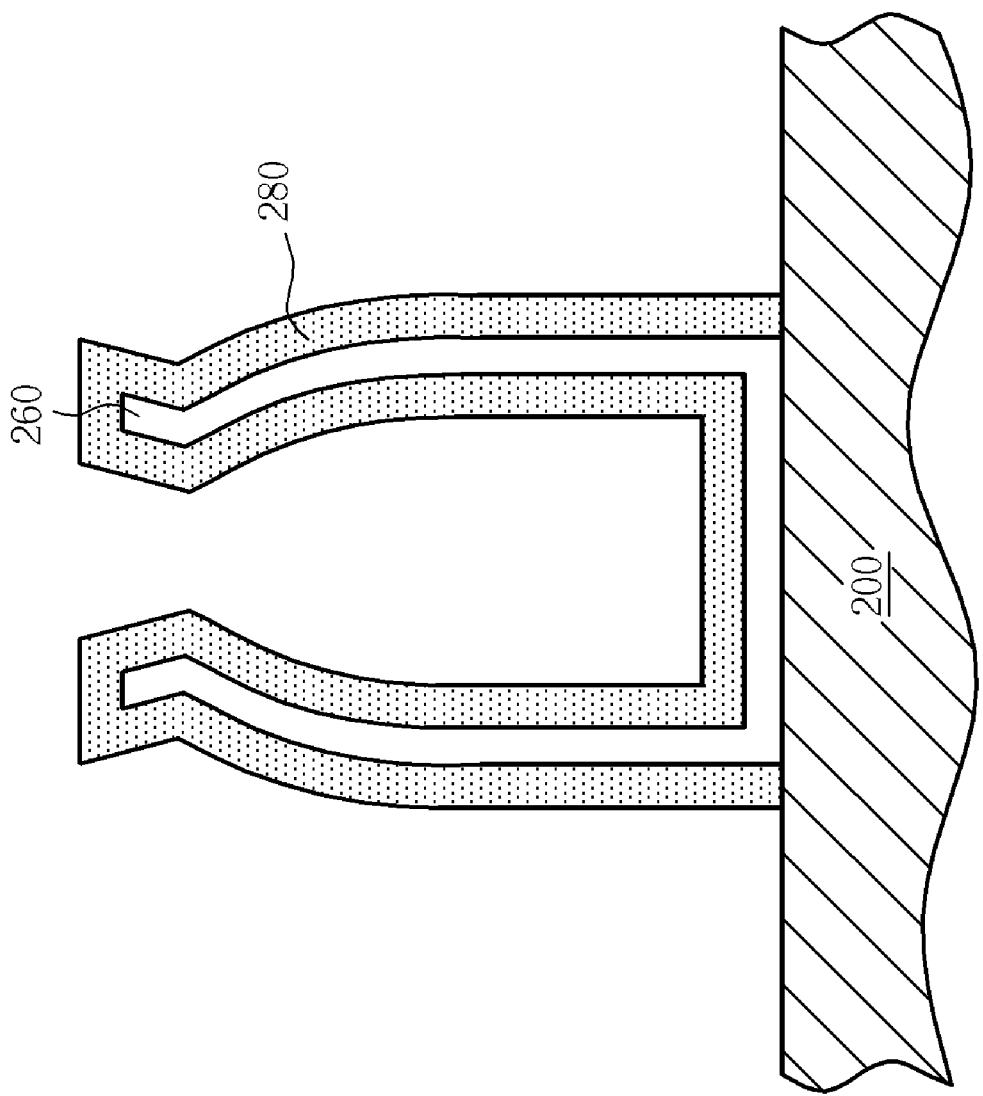

Following a dielectric layer 280 is deposited on the surface of the poly-Si layer 260 as the dielectric layer of the stack capacitor, shown in FIG. 2f. The dielectric layer 280 may include dielectric material such as $Al_2O_3$, $HfO_2$, $TiO_2$, or $ZrO_2$. For example, a dielectric material of about 50 Å thickness is deposited on the surface of the poly-Si layer 260 by CVD.

Figure 2G:
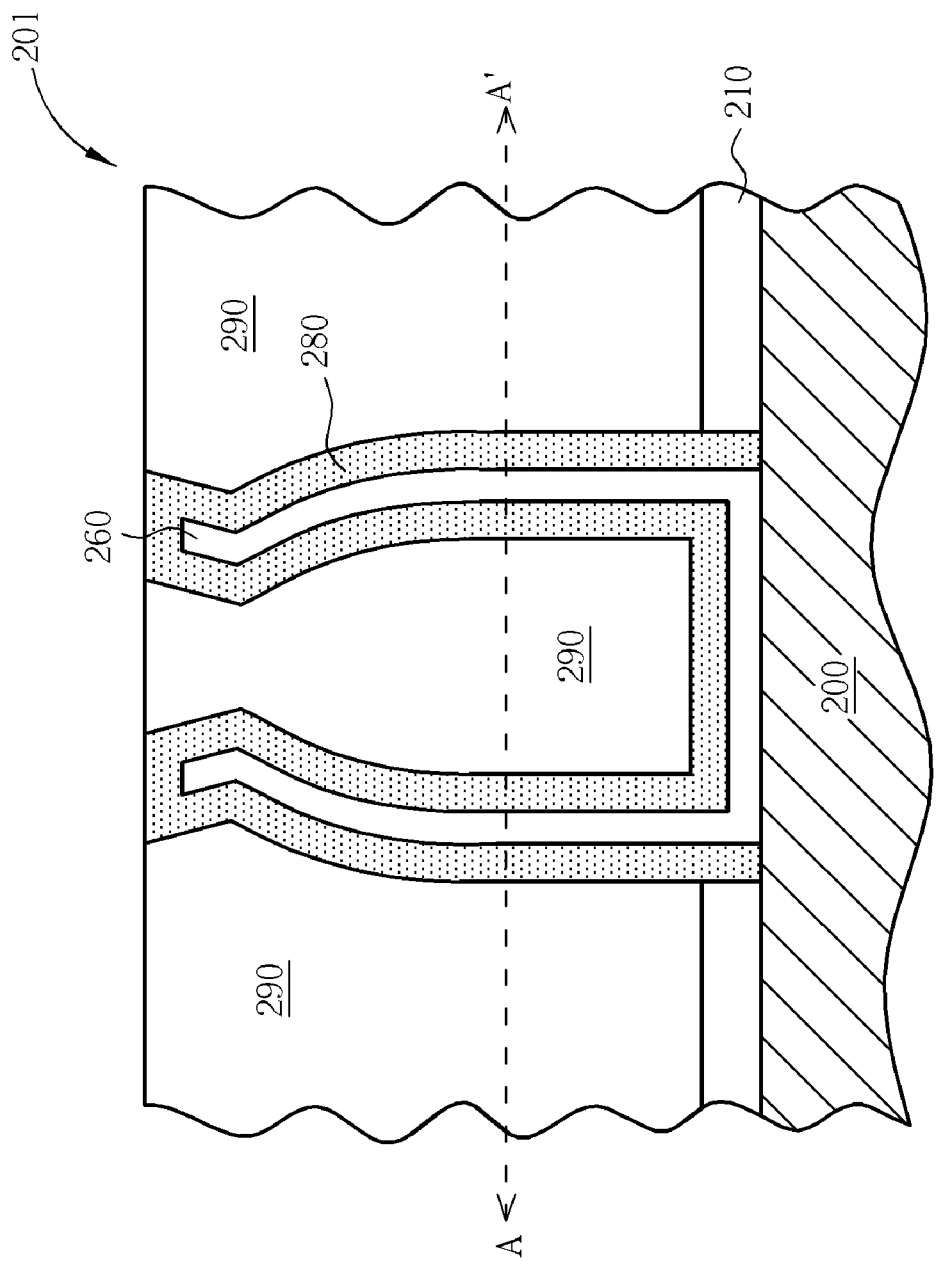

Afterwards, please refer to FIG. 2g. A conductive material 290 is deposited as the electrode of the stack capacitor 201 to finish the production of the stack capacitor 201. The conductive material 290 may include a metal such as titanium nitride. The cutaway view of A to A' illustrates that the structure of the stack capacitor 201 includes a composite structure: outer electrode (conductive material 290)—dielectric layer 280—inner electrode (poly-Si layer 260)—dielectric layer 280-electrode (conductive material 290)—dielectric layer 280—inner electrode (poly-Si layer 260)—dielectric layer 280—outer electrode (conductive material 290). For a limited space, the composite structure may increase the effective surface area by at least about 30%.

The present invention provides a method for forming a stack capacitor. The selective etching may eliminate the bowing issue. The static drying method may remove the liquid caused by the wet etching without damaging the structural integrity of the capacitor. In addition, the composite structure may increase the effective surface area by at least about 30% in a limited space. The present invention is especially suitable for forming a stack capacitor at a smaller critical dimension.

Those skilled in the art will readily observe that numerous modifications and alterations of the device and method may be made while retaining the teachings of the invention.

What is claimed is:

1. A method for forming a stack capacitor, comprising:
   providing a substrate with a bottom layer, a BPSG layer, a USG layer and a top layer formed on said substrate;
   using said top layer as a hard mask and said substrate as a first etching stop layer to perform a dry etching process to form a tapered first trench in said bottom layer, said BPSG layer and said USG layer;
   removing said top layer;
   performing a selective wet etching process to partially remove said BPSG layer to form a second trench with a bottle-like profile;
   depositing conformally a poly-Si layer on the inner wall of said second trench and on the surface of said USG layer;
   filling said second trench with a sacrificial layer;
   removing said poly-Si layer unmasked by said sacrificial layer to expose said USG layer;
   removing said sacrificial layer;
   using said bottom layer as a second etching stop layer to perform a wet etching process to remove said USG layer and said BPSG layer;
   performing a static drying process;
   depositing a dielectric layer; and
   depositing a conductive material to form said stack capacitor.

2. The method for forming the stack capacitor of claim 1, wherein said substrate is a semiconductor substrate.

3. The method for forming the stack capacitor of claim 1, wherein said bottom layer comprises a pad nitride layer and a buried SiN.

4. The method for forming the stack capacitor of claim 1, wherein said BPSG layer comprises a borosilicate glass.

5. The method for forming the stack capacitor of claim 1, wherein said BPSG layer comprises a borophosphosilicate glass.

6. The method for forming the stack capacitor of claim 1, wherein said top layer comprises poly-Si.

7. The method for forming the stack capacitor of claim 1, wherein said dry etching process comprises an RIE process.

8. The method for forming the stack capacitor of claim 1, wherein said selective wet etching process comprises using a dilute HF solution of 0.5 vol. %.

9. The method for forming the stack capacitor of claim 1, wherein said poly-Si layer is deposited by a low-pressure furnace method.

10. The method for forming the stack capacitor of claim 1, wherein said poly-Si layer which is not covered by said sacrificial layer is removed by a CMP method.

11. The method for forming the stack capacitor of claim 1, wherein said wet etching process is performed by a dilute HF solution.

12. The method for forming the stack capacitor of claim 11, wherein said dilute HF solution has a concentration of 5 vol. %.

13. The method for forming the stack capacitor of claim 1, wherein said static drying process comprises using a volatile solvent.

14. The method for forming the stack capacitor of claim 13, wherein said volatile solvent comprises an organic solvent.

15. The method for forming the stack capacitor of claim 14, wherein said organic solvent comprises isopropanol.

16. The method for forming the stack capacitor of claim 1, wherein said dielectric layer comprises $Al_2O_3$, $HfO_2$, $TiO_2$, or $ZrO_2$.

17. The method for forming the stack capacitor of claim 1, wherein said conductive material comprises a metal.

* * * * *